(12) United States Patent
Yokouchi (10) Patent No.: US 7,255,977 B2
(45) Date of Patent: Aug. 14, 2007

(54) METHOD OF MANUFACTURING NOZZLE PLATE

(75) Inventor: Tsutomu Yokouchi, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/514,898

(22) Filed: Sep. 5, 2006

(65) Prior Publication Data

US 2007/0054221 A1    Mar. 8, 2007

(30) Foreign Application Priority Data

Sep. 6, 2005    (JP)    ............................. 2005-257757

(51) Int. Cl.
*B41J 2/16* (2006.01)
(52) U.S. Cl. .................. 430/320; 205/75; 29/890.1
(58) Field of Classification Search ................ None
See application file for complete search history.

(56) References Cited

U.S. PATENT DOCUMENTS 4,246,076 A * 1/1981 Gardner .................... 205/73
6,397,466 B1 * 6/2002 Koyama et al. ........... 29/890.1

FOREIGN PATENT DOCUMENTS

| JP | 5-193144 A | 8/1993 |
|----|------------|--------|
| JP | 10-166595 A | 6/1998 |
| JP | 2001-329392 A | 11/2001 |
| JP | 2002-154210 A | 5/2002 |
| JP | 2002-019125 A * | 1/2007 |

* cited by examiner

Primary Examiner—John A McPherson
(74) Attorney, Agent, or Firm—Birch, Stewart, Kolasch & Birch, LLP (57) ABSTRACT

The method manufactures a nozzle plate including a nozzle having a tapered section where a diameter gradually decreases from a liquid supply side toward a liquid ejection side, and a straight section which is substantially cylindrical and is situated nearer a liquid ejection side of the tapered section. The method comprises the steps of: forming a first photosensitive material in a form of a layer on a substrate; placing a straight section forming member including a hole section having a shape substantially corresponding to a shape of the straight section, on the first photosensitive material; filling a second photosensitive material into the hole section; radiating a prescribed light toward the straight section forming member, in such a manner that substantially all of the second photosensitive material is exposed and the first photosensitive material is exposed in a tapered shape having a diameter which gradually increases toward the substrate; removing the straight section forming member from the first photosensitive material and the second photosensitive material; carrying out development of the first photosensitive material and the second photosensitive material after removing the straight section forming member from the first photosensitive material and the second photosensitive material; forming a metal layer which is to serve as the nozzle plate, on the substrate, by a plating method where the first photosensitive material and the second photosensitive material left on the substrate after carrying out the development of the first photosensitive material and the second photosensitive material are used as a mold; and removing the metal layer from the substrate, the first photosensitive material and the second photosensitive material.

3 Claims, 10 Drawing Sheets

METHOD OF MANUFACTURING NOZZLE PLATE

BACKGROUND OF THE INVENTION

1. Field of the Invention

The present invention relates to a method of manufacturing a nozzle plate, and more particularly, to a method of manufacturing a nozzle plate having a nozzle of a cross-sectional shape which is formed by combining a tapered section and a straight section.

2. Description of the Related Art

An inkjet recording apparatus (inkjet printer) is known which forms a desired image on a recording medium by ejecting ink droplets from nozzles toward a recording medium, while causing a print head including a nozzle plate having a plurality of nozzles on an ejection surface opposing the recording medium to move relatively with respect to the recording medium.

In a print head of this kind, if dimensional accuracy is poor in terms of the shape and position of the nozzles formed in the nozzle plate, or the like, then variations occur in the size (volume) of the ink droplets, their direction of flight and their speed of flight. Consequently, image deterioration may occur and the ink ejection efficiency may decline. Therefore, various methods of manufacturing a nozzle plate have been proposed in order to resolve this problem (see, for example, Japanese Patent Application Publication No. 2001-329392, Japanese Patent Application Publication No. 5-193144, Japanese Patent Application Publication No. 2002-154210 and Japanese Patent Application Publication No. 10-166595.)

Japanese Patent Application Publication No. 2001-329392 discloses a method of manufacturing a nozzle plate where tapered nozzles are formed by forming a taper-shaped electroforming mold by light exposure using diffused light, in order to stabilize the position of the ink meniscus and suppress the loss of ejection energy.

Japanese Patent Application Publication No. 5-193144 discloses a method of manufacturing a nozzle plate in order to stabilize the ink ejection direction. In the method, a member having guaranteed nozzle diameters formed by pressing a metal is obtained, a photosensitive dry film is laminated thereon, and light exposure with scattered light is performed from the metal side, thereby forming nozzles in which the metal side has a straight shape and the dry film side has a tapered shape.

Japanese Patent Application Publication No. 2002-154210 discloses a method of manufacturing a nozzle plate in order to stabilize the ejection direction of very fine ink droplets. In the method, a photosensitive resin is exposed in a straight shape by using a normal mask, and the photosensitive resin is then exposed using a graduated mask having a light transmissivity that changes gradually rather than being uniform. When the resin is developed, nozzles are obtained in which the ink inlet side has a curved shape and the outlet side has a straight shape.

Japanese Patent Application Publication No. 10-166595 discloses a method of manufacturing a nozzle plate, in order to stabilize the ink ejection direction. In the method, resist is coated onto the entire surface of a nozzle forming member in which nozzles having an overhang shape have been formed, exposure and development are carried out from the ejection surface side, and electroforming is carried out from the opposite side (ink supply side), thereby forming nozzles having a substantially cylindrical shape (or a substantially circular conic/trapezoid shape).

However, there are problems of the following kinds in the above methods of manufacturing nozzle plates.

In the method disclosed in Japanese Patent Application Publication No. 2001-329392, there is no straight section in the nozzles and the ink ejection direction is not stable. Furthermore, since a tapered electroforming mold is used, then if there is variation in the thickness of the electroforming film, albeit a very slight variation, this could cause variation in the nozzle diameters, and hence lead to a decline in ejection efficiency.

In the method disclosed in Japanese Patent Application Publication No. 5-193144, resin material (dry film) is disposed on the ink flow channel side, and there is a possibility that problems with the resistance to ink may arise.

In the method disclosed in Japanese Patent Application Publication No. 2002-154210, since exposure steps are required to be performed twice, positional displacement can readily occur between the steps, leading to a decline in the dimensional accuracy of the nozzles, which in turn causes a decline in the ejection efficiency and fluctuation in the ejection direction.

In the method disclosed in Japanese Patent Application Publication No. 10-166595, since the nozzles have an overhang shape, variation in the nozzle diameter is liable to occur and it is difficult to stabilize the ink ejection direction.

SUMMARY OF THE INVENTION

The present invention is contrived in view of the aforementioned circumstances, an object thereof being to provide a method of manufacturing a nozzle plate that can improve the ejection efficiency and can stabilize the ejection direction and ejection volume.

In order to attain the aforementioned object, the present invention is directed to a method of manufacturing a nozzle plate including a nozzle having a tapered section where a diameter gradually decreases from a liquid supply side toward a liquid ejection side, and a straight section which is substantially cylindrical and is situated nearer a liquid ejection side of the tapered section, the method comprising the steps of: forming a first photosensitive material in a form of a layer on a substrate; placing a straight section forming member including a hole section having a shape substantially corresponding to a shape of the straight section, on the first photosensitive material; filling a second photosensitive material into the hole section; radiating a prescribed light toward the straight section forming member, in such a manner that substantially all of the second photosensitive material is exposed and the first photosensitive material is exposed in a tapered shape having a diameter which gradually increases toward the substrate; removing the straight section forming member from the first photosensitive material and the second photosensitive material; carrying out development of the first photosensitive material and the second photosensitive material after removing the straight section forming member from the first photosensitive material and the second photosensitive material; forming a metal layer which is to serve as the nozzle plate, on the substrate, by a plating method where the first photosensitive material and the second photosensitive material left on the substrate after carrying out the development of the first photosensitive material and the second photosensitive material are used as a mold; and removing the metal layer from the substrate, the first photosensitive material and the second photosensitive material.

According to this aspect of the present invention, a first photosensitive material is formed in the shape of a layer on the substrate, a straight section forming member is placed on the first photosensitive material, and a second photosensitive material is filled into the hole section of the straight section forming member, whereupon exposure is carried out by radiating a prescribed light from the straight section forming member side, the straight section forming member is then removed and a development process is carried out, thereby making it possible to form photosensitive material having a tapered and straight shape on the substrate, with good accuracy. By forming a nozzle plate by plating method, using this photosensitive material as a mold, it is possible to form a tapered and straight-shaped nozzle to a high degree of accuracy. Therefore, the ejection efficiency is improved and the ejection direction and ejection volume are stabilized.

Preferably, the method of manufacturing a nozzle plate further comprises the step of forming the straight section forming member by electroforming.

According to this aspect of the present invention, it is possible to reuse the straight section forming member, and therefore nozzle plates can be manufactured at low cost.

Preferably, the method of manufacturing a nozzle plate further comprises the step of forming a liquid repellent film on a surface of a liquid ejection side of the nozzle plate.

According to this aspect of the present invention, since the liquid is prevented from adhering to the periphery of the nozzle, then the ejection direction can be further stabilized.

According to the present invention, a first photosensitive material is formed in the shape of a layer on the substrate, a straight section forming member is placed on the first photosensitive material, and a second photosensitive material is filled into a hole section of the straight section forming member, whereupon exposure is carried out by radiating a prescribed light from the straight section forming member side, the straight section forming member is then removed and a development process is carried out, thereby making it possible to form photosensitive material having a tapered and straight shape on the substrate, with good accuracy. By forming a nozzle plate by plating method, using this photosensitive material as a mold, it is possible to form a tapered and straight-shaped nozzle to a high degree of accuracy. Therefore, the ejection efficiency can be improved and the ejection direction and ejection volume can be stabilized.

BRIEF DESCRIPTION OF THE DRAWINGS

The nature of this invention, as well as other objects and benefits thereof, will be explained in the following with reference to the accompanying drawings, in which like reference characters designate the same or similar parts throughout the figures and wherein.

DETAILED DESCRIPTION OF THE PREFERRED EMBODIMENTS

General Composition of Inkjet Recording Apparatus

Figure 1:
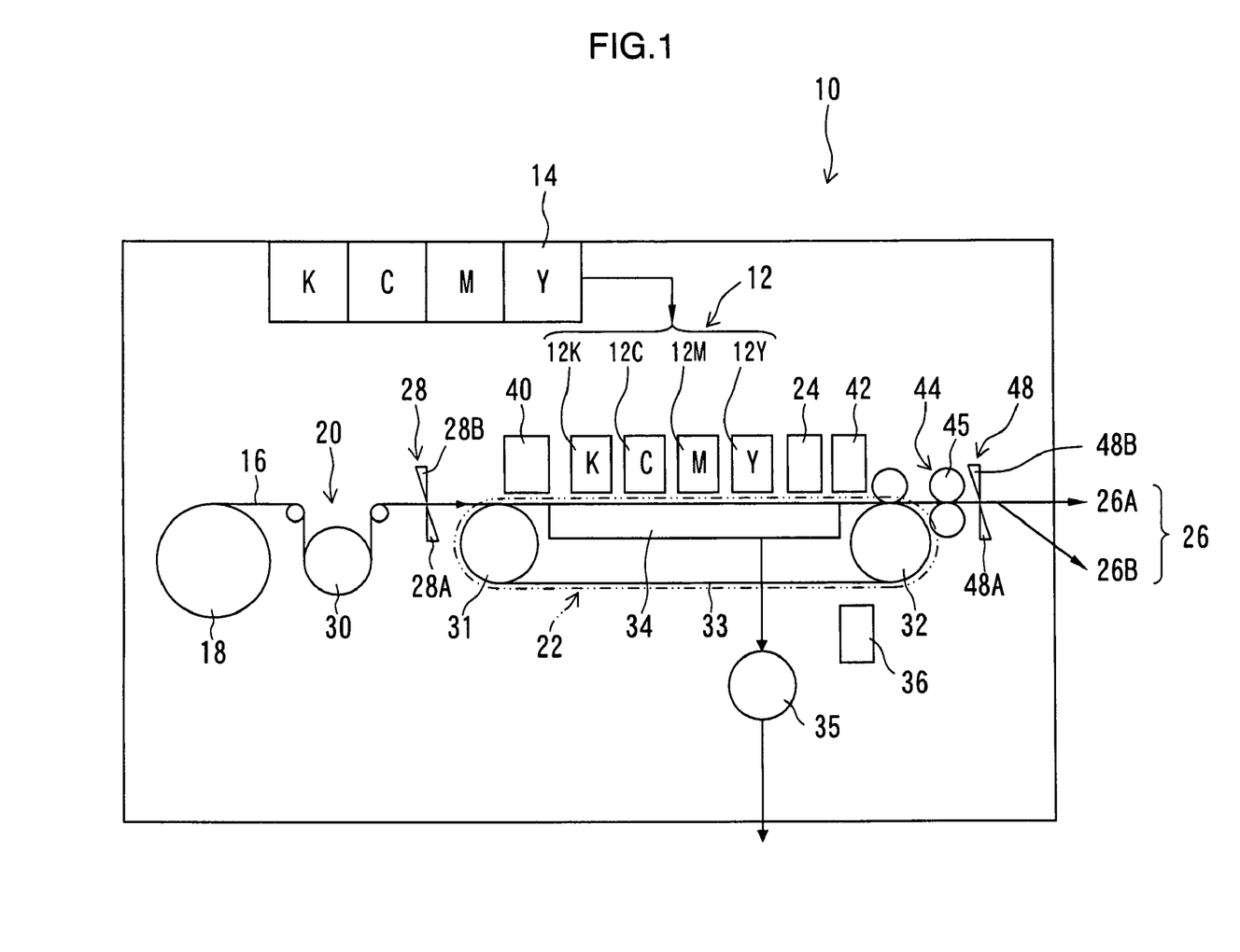
FIG. 1 is a general schematic drawing showing a general view of an inkjet recording apparatus.

FIG. 1 is a diagram of the general composition of an inkjet recording apparatus as an embodiment of an image forming apparatus relating to the present invention. As shown in FIG. 1, the inkjet recording apparatus 10 comprises: a printing unit 12 having a plurality of print heads 12K, 12C, 12M, and 12Y for ink colors of black (K), cyan (C), magenta (M), and yellow (Y), respectively; an ink storing and loading unit 14 for storing inks of K, C, M and Y to be supplied to the print heads 12K, 12C, 12M, and 12Y; a paper supply unit 18 for supplying recording paper 16; a decurling unit 20 for removing curl in the recording paper 16; a suction belt conveyance unit 22 disposed facing the nozzle face (ink-droplet ejection face) of the print unit 12, for conveying the recording paper 16 while keeping the recording paper 16 flat; a print determination unit 24 for reading the printed result produced by the printing unit 12; and a paper output unit 26 for outputting image-printed recording paper (printed matter) to the exterior.

In FIG. 1, a magazine for rolled paper (continuous paper) is shown as an embodiment of the paper supply unit 18; however, more magazines with paper differences such as paper width and quality may be jointly provided. Moreover, papers may be supplied with cassettes that contain cut papers loaded in layers and that are used jointly or in lieu of the magazine for rolled paper.

In the case of a configuration in which roll paper is used, a cutter 28 is provided as shown in FIG. 1, and the roll paper is cut to a desired size by the cutter 28. The cutter 28 has a stationary blade 28A, whose length is not less than the width of the conveyor pathway of the recording paper 16, and a round blade 28B, which moves along the stationary blade 28A. The stationary blade 28A is disposed on the reverse side of the printed surface of the recording paper 16, and the round blade 28B is disposed on the printed surface side across the conveyance path. When cut paper is used, the cutter 28 is not required.

In the case of a configuration in which a plurality of types of recording paper can be used, it is preferable that an information recording medium such as a bar code and a wireless tag containing information about the type of paper is attached to the magazine, and by reading the information contained in the information recording medium with a predetermined reading device, the type of paper to be used is automatically determined, and ink-droplet ejection is controlled so that the ink-droplets are ejected in an appropriate manner in accordance with the type of paper.

The recording paper 16 delivered from the paper supply unit 18 retains curl due to having been loaded in the magazine. In order to remove the curl, heat is applied to the recording paper 16 in the decurling unit 20 by a heating drum 30 in the direction opposite to the curl direction in the magazine. The heating temperature at this time is preferably controlled so that the recording paper 16 has a curl in which the surface on which the print is to be made is slightly round outward.

The decurled and cut recording paper 16 is delivered to the suction belt conveyance unit 22. The suction belt conveyance unit 22 has a configuration in which an endless belt 33 is set around rollers 31 and 32 so that the portion of the endless belt 33 facing at least the nozzle face of the printing unit 12 and the sensor face of the print determination unit 24 forms a plane.

The belt 33 has a width that is greater than the width of the recording paper 16, and a plurality of suction apertures (not shown) are formed on the belt surface. A suction chamber 34 is disposed in a position facing the sensor surface of the print determination unit 24 and the nozzle surfaces of the printing unit 12 on the interior side of the belt 33, which is set around the rollers 31 and 32 as shown in FIG. 1. The suction chamber 34 provides suction with a fan 35 to generate a negative pressure, and the recording paper 16 on the belt 33 is held by suction.

The belt 33 is driven in the clockwise direction in FIG. 1 by the motive force of a motor (not shown) being transmitted to at least one of the rollers 31 and 32, which the belt 33 is set around, and the recording paper 16 held on the belt 33 is conveyed from left to right in FIG. 1.

Since ink adheres to the belt 33 when a marginless print job or the like is performed, a belt-cleaning unit 36 is disposed in a predetermined position (a suitable position outside the printing area) on the exterior side of the belt 33. Although the details of the configuration of the belt-cleaning unit 36 are not shown, embodiments thereof include a configuration in which the belt 33 is nipped with cleaning rollers such as a brush roller and a water absorbent roller, an air blow configuration in which clean air is blown onto the belt 33, or a combination of these. In the case of the configuration in which the belt 33 is nipped with the cleaning rollers, it is preferable to make the line velocity of the cleaning rollers different from that of the belt 33 to improve the cleaning effect.

The inkjet recording apparatus 10 may comprise a roller nip conveyance mechanism, instead of the suction belt conveyance unit 22. However, there is a drawback in the roller nip conveyance mechanism that the print tends to be smeared when the printing area is conveyed by the roller nip action because the nip roller makes contact with the printed surface of the paper immediately after printing. Therefore, the suction belt conveyance in which nothing comes into contact with the image surface in the printing area is preferable.

A heating fan 40 is disposed before the printing unit 12 in the conveyance pathway formed by the suction belt conveyance unit 22. The heating fan 40 blows heated air onto the recording paper 16 to heat the recording paper 16 immediately before printing so that the ink deposited on the recording paper 16 dries more easily.

The print unit 12 is a so-called "full line head" in which a line head having a length corresponding to the maximum paper width is arranged in a direction (main scanning direction) that is perpendicular to the paper conveyance direction (sub-scanning direction). The print heads 12K, 12C, 12M and 12Y forming the print unit 12 are constituted by line heads in which a plurality of ink ejection ports (nozzles) are arranged through a length exceeding at least one edge of the maximum size recording paper 16 intended for use with the inkjet recording apparatus 10.

The print heads 12K, 12C, 12M, and 12Y are arranged in the order of black (K), cyan (C), magenta (M), and yellow (Y) from the upstream side (left hand side in FIG. 1), in the conveyance direction of the recording paper 16 (paper conveyance direction). A color image can be formed on the recording paper 16 by ejecting the inks from the print heads 12K, 12C, 12M, and 12Y, respectively, onto the recording paper 16 while the recording paper 16 is conveyed.

The print unit 12, in which the full-line heads covering the entire width of the paper are thus provided for the respective ink colors, can record an image over the entire surface of the recording paper 16 by performing the action of moving the recording paper 16 and the print unit 12 relatively to each other in the paper conveyance direction (sub-scanning direction) just once (in other words, by means of a single sub-scan). Higher-speed printing is thereby made possible and productivity can be improved, in comparison with a shuttle type head configuration in which a print head moves reciprocally in a direction (main scanning direction) that is perpendicular to the paper conveyance direction.

Although a configuration with four standard colors, K C M and Y, is described in the present embodiment, the combinations of the ink colors and the number of colors are not limited to these, and light and/or dark inks can be added as required. For example, a configuration is possible in which print heads for ejecting light-colored inks such as light cyan and light magenta are added.

As shown in FIG. 1, the ink storing and loading unit 14 has ink tanks for storing the inks of the colors corresponding to the respective print heads 12K, 12C, 12M, and 12Y, and the respective tanks are connected to the print heads 12K, 12C, 12M, and 12Y by means of channels (not shown). The ink storing and loading unit 14 has a warning device (for example, a display device, an alarm sound generator, or the like) for warning when the remaining amount of any ink is low, and has a mechanism for preventing loading errors among the colors.

The print determination unit 24 has an image sensor (line sensor, or the like) for capturing an image of the ink-droplet deposition result of the printing unit 12, and functions as a device to check for ejection defects such as clogs of the nozzles in the printing unit 12 from the ink-droplet deposition results evaluated by the image sensor.

The print determination unit 24 of the present embodiment is configured with at least a line sensor having rows of photoelectric transducing elements with a width that is greater than the ink-droplet ejection width (image recording width) of the print heads 12K, 12C, 12M, and 12Y. This line sensor has a color separation line CCD sensor including a red (R) sensor row composed of photoelectric transducing elements (pixels) arranged in a line provided with an R filter, a green (G) sensor row with a G filter, and a blue (B) sensor row with a B filter. Instead of a line sensor, it is possible to use an area sensor composed of photoelectric transducing elements that are arranged two-dimensionally.

The print determination unit 24 reads a test pattern image printed by the print heads 12K, 12C, 12M, and 12Y for the respective colors, and the ejection of each head is determined. The ejection determination includes the presence of the ejection, measurement of the dot size, and measurement of the dot deposition position.

A post-drying unit 42 is disposed following the print determination unit 24. The post-drying unit 42 is a device to dry the printed image surface, and includes a heating fan, for example. It is preferable to avoid contact with the printed surface until the printed ink dries, and a device that blows heated air onto the printed surface is preferable.

In cases in which printing is performed with dye-based ink on porous paper, blocking the pores of the paper by the application of pressure prevents the ink from coming contact with ozone and other substances that cause dye molecules to break down, and has the effect of increasing the durability of the print.

A heating/pressurizing unit 44 is disposed following the post-drying unit 42. The heating/pressurizing unit 44 is a device to control the glossiness of the image surface, and the image surface is pressed with a pressure roller 45 having a predetermined uneven surface shape while the image surface is heated, and the uneven shape is transferred to the image surface.

The printed matter generated in this manner is outputted from the paper output unit 26. The target print (i.e., the result of printing the target image) and the test print are preferably outputted separately. In the inkjet recording apparatus 10, a sorting device (not shown) is provided for switching the outputting pathways in order to sort the printed matter with the target print and the printed matter with the test print, and to send them to paper output units 26A and 26B, respectively. When the target print and the test print are simultaneously formed in parallel on the same large sheet of paper, the test print portion is cut and separated by a cutter (second cutter) 48. The cutter 48 is disposed immediately before the paper output unit 26, and is used for cutting the test print portion from the target print portion when a test print has been performed in the blank portion of the target print. The structure of the cutter 48 is the same as the first cutter 28 described above, and has a stationary blade 48A and a round blade 48B.

Although not shown in drawings, the paper output unit 26A for the target prints is provided with a sorter for collecting prints according to print orders.

Structure of the Print Heads

Next, the structure of a print head is described. The print heads 12K, 12M, 12C and 12Y provided for the respective ink colors have the same structure, and therefore a reference numeral 50 is hereinafter designated to a representative embodiment of these print heads.

Figure 2:
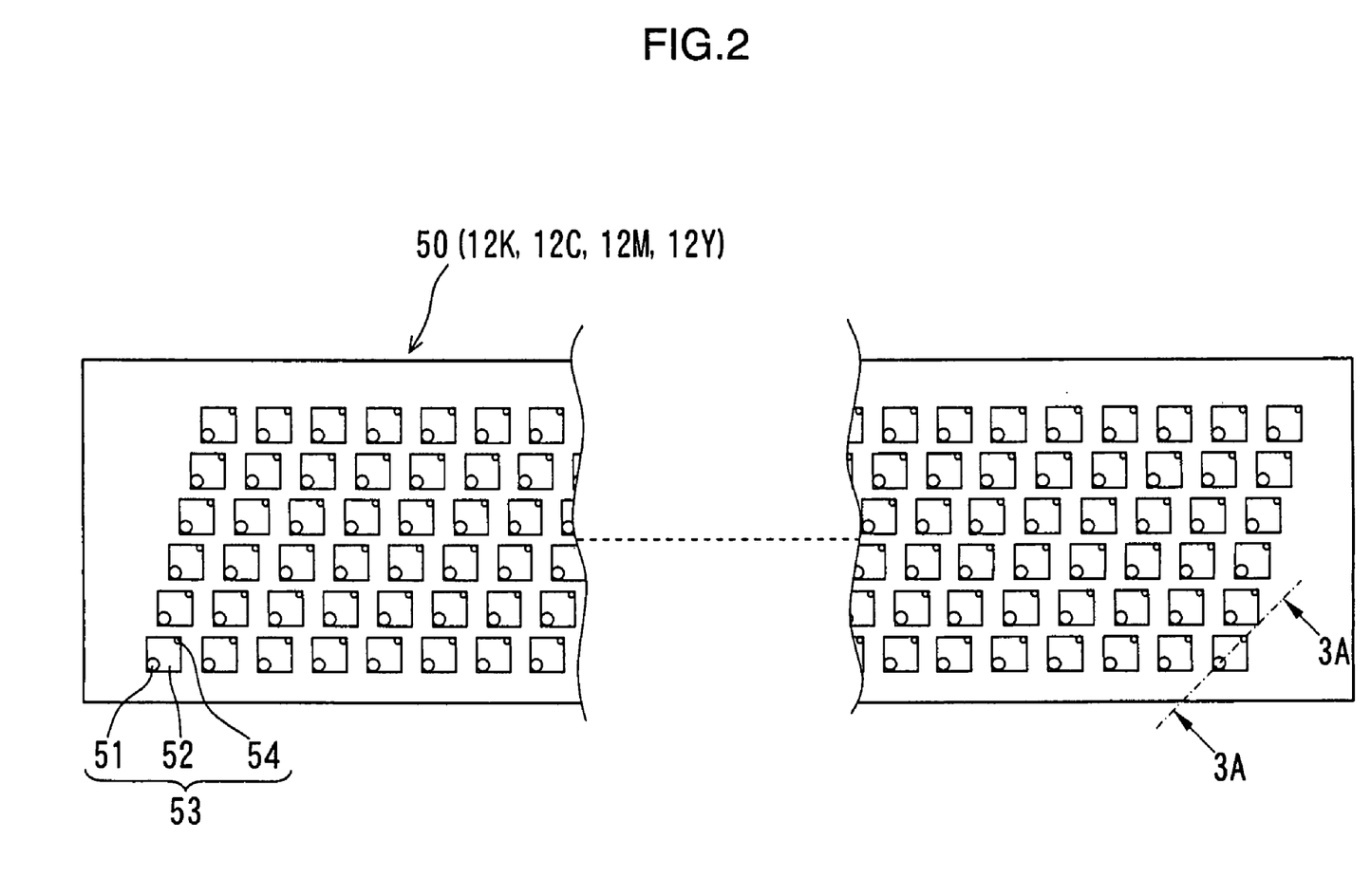
FIG. 2 is a plan perspective diagram showing an embodiment of the structure of a print head.

FIG. 2 is a plan view perspective diagram showing an embodiment of the structure of a print head 50. As shown in FIG. 2, the print head 50 of the present embodiment has a structure in which pressure chamber units 53, each comprising a nozzle 51, a pressure chamber 52 and a supply port 54, are arranged in a staggered matrix configuration (two-dimensional configuration). The projected nozzle row obtained by projecting the nozzles to an alignment in the lengthwise direction of the print head 50 (main scanning direction) has nozzles arranged at a uniform nozzle pitch, and hence a high density can be achieved for the pitch of the dots printed onto the surface of the recording paper.

Figure 3A:
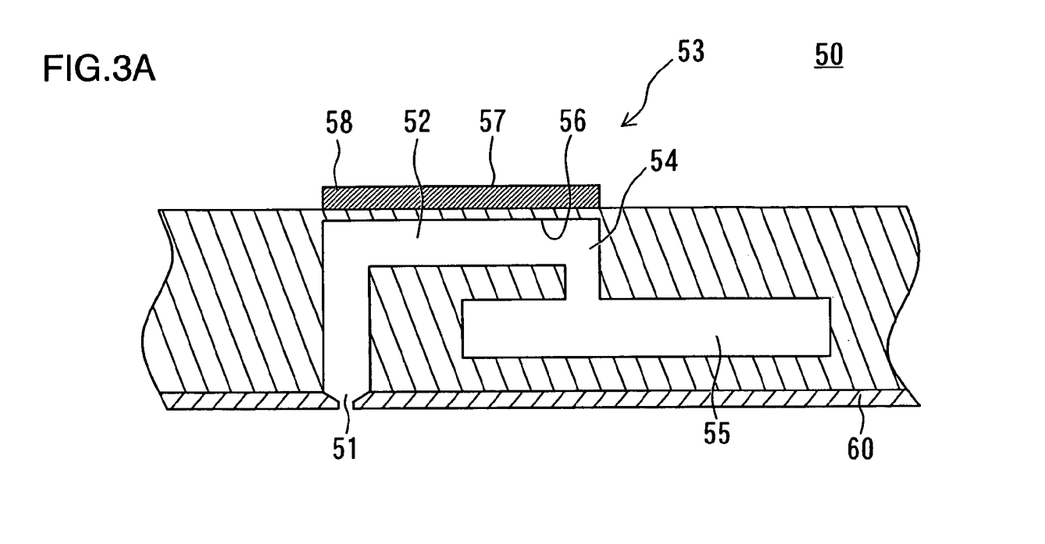
FIGS. 3A and 3B are cross-sectional diagrams along line 3A-3A in FIG. 2.
Figure 3B:
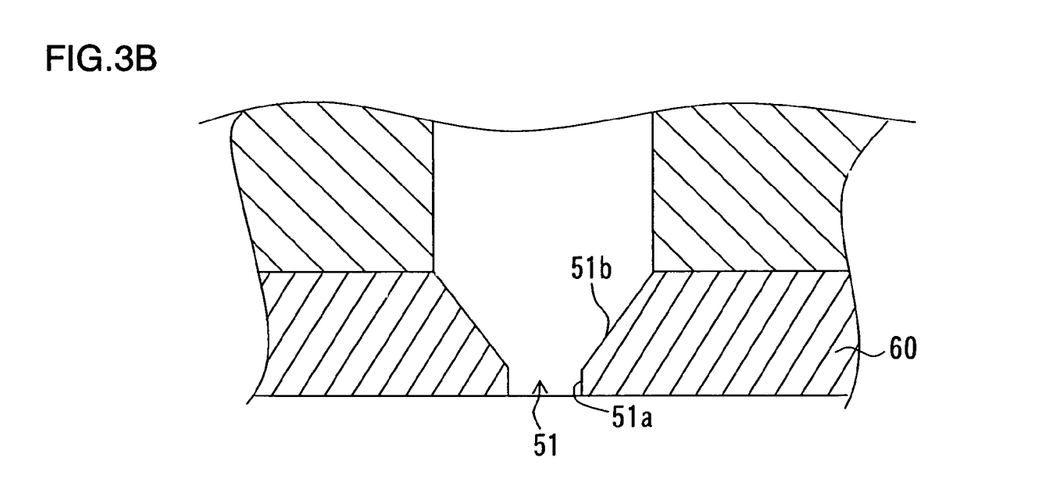

FIG. 3A is a cross-sectional diagram along line 3A-3A in FIG. 2; and FIG. 3B is an enlarged diagram of the peripheral region of a nozzle. As shown in FIGS. 3A and 3B, the ink ejection surface of the print head 50 is constituted by a nozzle plate 60. A nozzle 51 formed in the nozzle plate 60 is connected to one end of a pressure chamber 52. A supply port 54 is formed on the other end of the pressure chamber 52, and the pressure chamber 52 is connected to a common flow channel 55 by means of this supply port 54. The common flow channel 55 accumulates ink to be supplied from the ink storing and loading unit 14 in FIG. 1, and this ink is supplied to the pressure chambers 52 via the supply ports 54.

Piezoelectric elements 58 which each are provided with an individual electrode 57 are provided on the diaphragm 56 which forms the upper wall of the pressure chambers 52, at positions corresponding to the pressure chambers 52. The diaphragm 56 is made of a conductive member of stainless steel, or the like, and it also serves as a common electrode for a plurality of piezoelectric elements 58. It is also possible to make the diaphragm 56 from a non-conducting member and form a conductive layer on the surface thereof. When a drive signal (drive voltage) is applied to a piezoelectric element 58, the piezoelectric element 58 deforms in such a manner that it causes the diaphragm 56 to bend toward the pressure chamber 52 side, whereby the ink inside the pressure chamber 52 is pressurized and an ink droplet is ejected from the nozzle 51.

In the present embodiment, the nozzles 51 formed in the nozzle plate 60 each includes a straight section 51a having a substantially cylindrical shape, and a tapered section 51b having a diameter which increases gradually from the ink ejection side toward the ink flow channel side, which is opposite to the ink ejection side. The straight section 51a is located on the ink ejection side, and the tapered section 51b is located on the ink flow channel side. The internal diameter of the straight section 51a and the minimum diameter of the tapered section 51b are substantially the same. Hence, each nozzle has a cross section of such a tapered and straight shape. According to the nozzles 51 having this tapered and straight shape, ink ejection efficiency can be improved and the ink ejection direction can be stabilized, in comparison with nozzles of another shape. Furthermore, since the nozzles 51 having a tapered and straight shape are formed with good dimensional accuracy by a method of manufacturing of a nozzle plate 60 described hereinafter. Therefore the ink ejection efficiency can be further improved and the ink ejection volume can be stabilized, in comparison with a case where nozzles of the same shape are formed by another method of manufacture. Consequently, it is possible to form an image of good quality.

In the present embodiment, a piezoelectric method by which ink is ejected by using the deformation of piezoelectric elements is employed; however, an ink ejection method which is implemented in embodiments of the present invention is not limited, and it is possible, for example, to adopt a thermal jet method, or the like. According to the thermal jet method, an air bubble is generated by heating the ink by means of a heat generating body, such as a heater, and an ink droplet is propelled by the pressure of this air bubble.

Method for Manufacturing Nozzle Plate

Next, first to fourth embodiments of the method of manufacturing a nozzle plate 60, in relation to the characteristic of the present invention, are described.

FIRST EMBODIMENT

FIGS. 4A to 4G are illustrative diagrams showing a method of manufacturing a nozzle plate 60 according to a first embodiment.

Figure 4A:
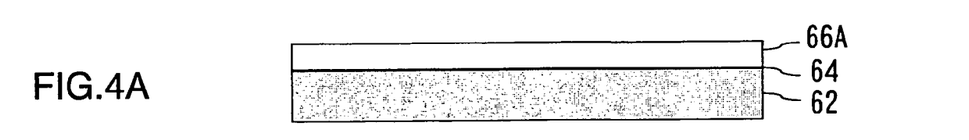
FIGS. 4A to 4G are illustrative diagrams showing a method of manufacturing a nozzle plate according to a first embodiment.
Figure 4B:
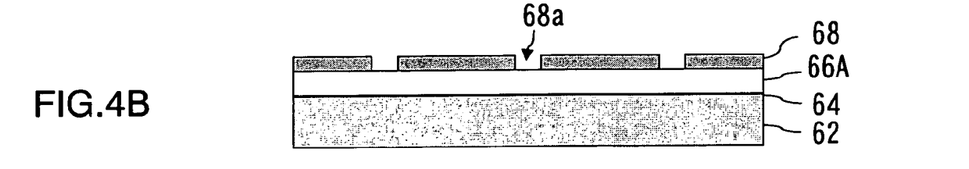
Figure 4C:
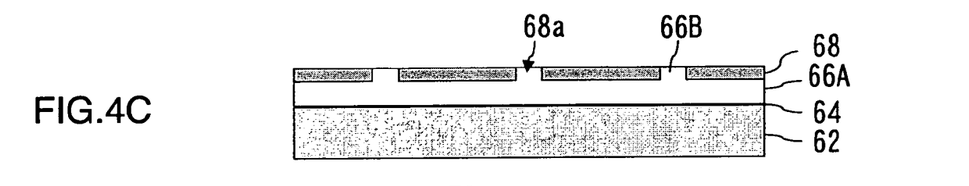

Firstly, as shown in FIG. 4A, a negative resist 66A (nega-type resist: first photosensitive material) is applied onto the conductive film 64 (electrode for electroforming) formed on a matrix 62 (substrate), and the negative resist 66A is pre-baked. Instead of disposing the conductive film 64 on the matrix 62, it is possible to compose the matrix 62 from a conducting material, such as stainless steel. In the present embodiment, a resist 66A in liquid form is used, but it is also possible to use a resist in the form of a film. Next, as shown in FIG. 4B, a straight section forming member 68 is attached onto the resist 66A. The straight section forming member 68 has hole sections 68a which correspond to the straight sections of the nozzles 51. By previously fabricating a straight section forming member 68 by electroforming, it is possible to reuse the straight section forming member 68, and hence a nozzle plate 60 can be manufactured at low cost. To give one embodiment of the dimensions of the resist 66A and the straight section forming member 68 which are formed in this way, the thickness of the resist 66A is approximately 20 μm, the thickness of the straight section forming member 68 is approximately 10 μm, and the hole diameter of the hole sections 68a is approximately 20 μm. Next, as shown in FIG. 4C, resist 66B (second photosensitive material) is reapplied from the straight section forming member 68 side, and resist 66B is filled into the hole sections 68a in the straight section forming member 68. Thereupon, pre-baking to the resist is carried out again. In the following description, the resists 66A and 66B are generally designated by the reference numeral 66.

Figure 4D:
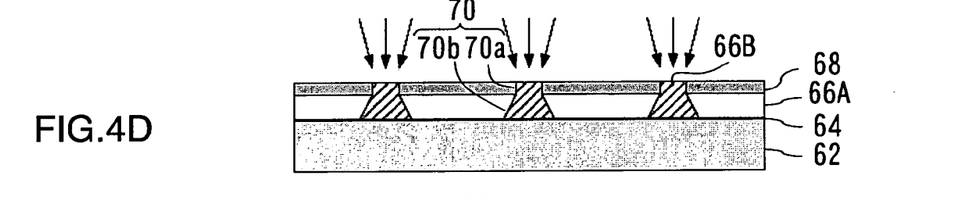

Next, as shown in FIG. 4D, exposure is performed from the straight section forming member 68 side (toward the straight section forming member 68), and the resist 66 (66A, 66B) is exposed (is reacted with light) in a tapered and straight shape. In the following description, the exposed portions of the resist 66 are called the exposure resist sections, and are indicated by the reference numeral 70. The exposure resist sections 70 each include a straight section 70a which is the portion corresponding to the straight section forming substrate 68, and a tapered section 70b having a diameter which gradually increases from the straight section forming member 68 side toward the side of the matrix 62 side, as shown in FIG. 4D.

Figure 5A:
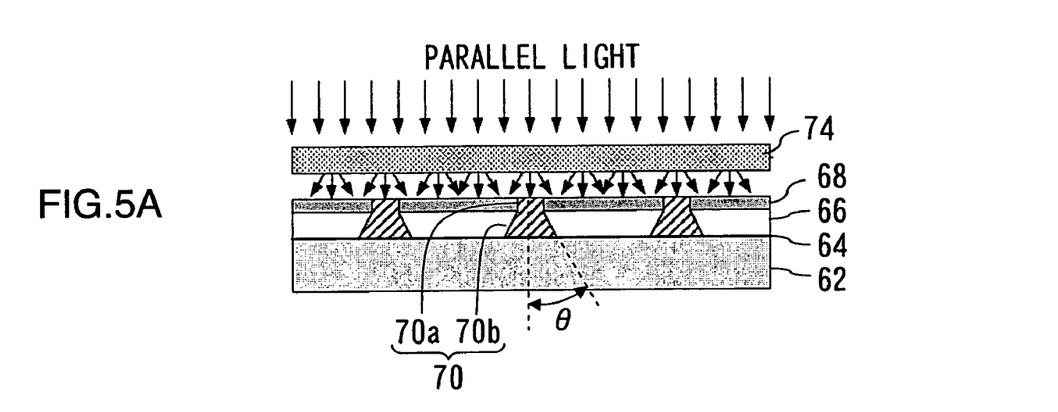
FIGS. 5A to 5C are illustrative diagrams showing embodiments of exposure methods.
Figure 5B:
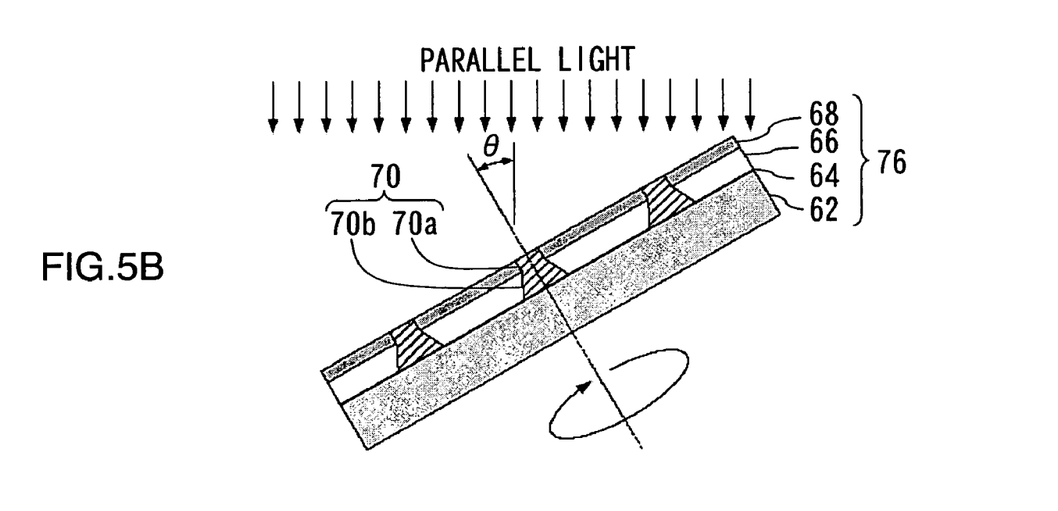
Figure 5C:
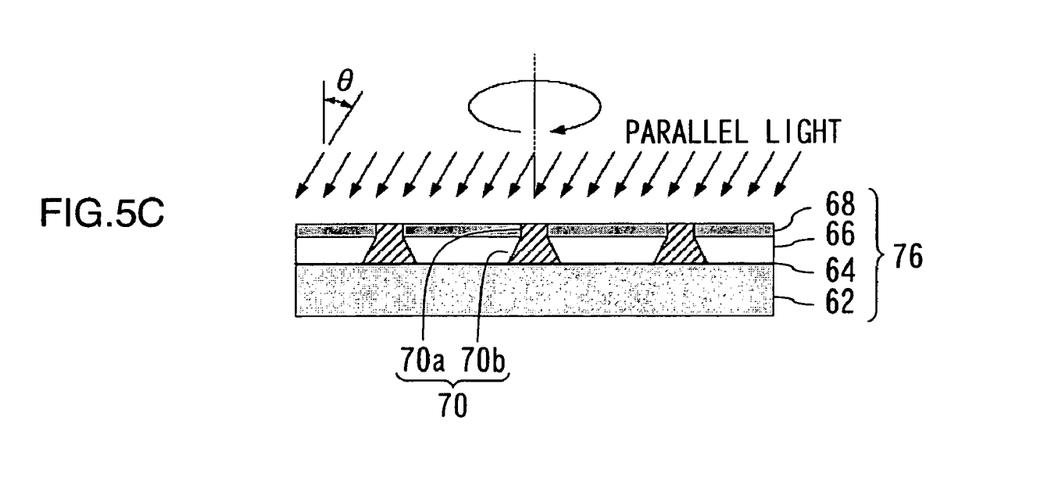

Here, exposure methods are described with reference to FIGS. 5A to 5C. In order to form the exposure resist sections 70 in a tapered and straight shape, in the present embodiment, light is radiated at a prescribed angle onto the resist 66 via the hole sections 68a in the straight section forming member 68. For example, by passing parallel light through a dispersion plate 74 and thus radiating the dispersed light from the straight section forming substrate 68 side (toward the straight section forming substrate 68), as shown in FIG. 5A, it is possible to form the exposure resist sections 70 in a tapered and straight shape. Furthermore, it is also possible to tilt the substrate 76 having the resist 66 to an oblique angle with respect to the parallel light, and perform exposure while the substrate 76 is rotated, as shown in FIG. 5B. Moreover, as shown in FIG. 5C, it is also possible to perform exposure by radiating parallel light that has been tilted to an oblique angle with respect to the substrate 76, and rotating this parallel light about the central axis of the substrate 76. The angle of taper, θ, of the tapered section 70b of each exposure resist section 70 can be controlled to a desired angle of taper by changing the type of dispersion plate 74, the angle of the substrate 76, or the angle of the radiated light. From the viewpoint of achieving stable ejection, the angle of taper, θ, desirably falls within a range of 15° to 45°, and more desirably, the angle of taper, θ, is 20°.

Figure 4E:
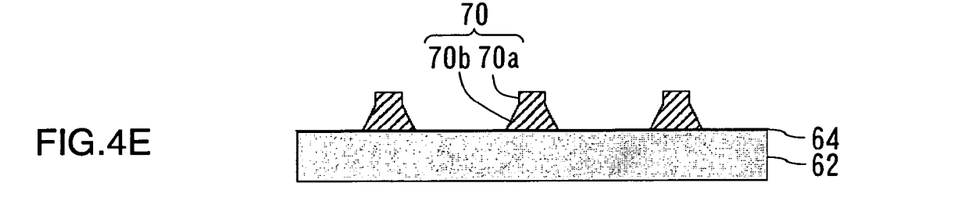
Figure 4F:
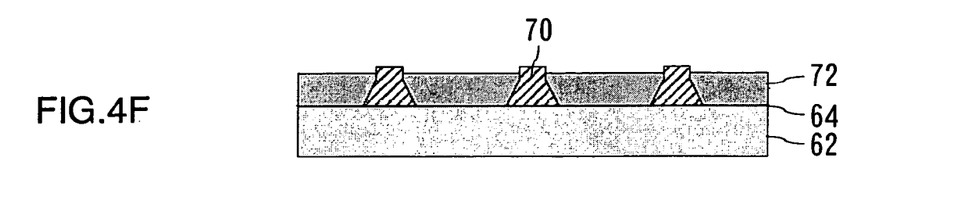
Figure 4G:
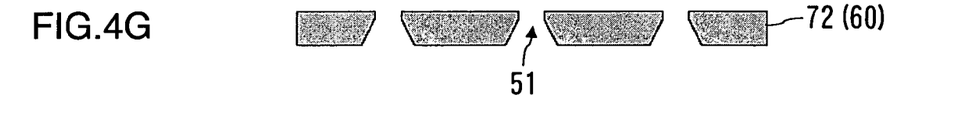

Next, as shown in FIG. 4E, the straight section forming member 68 is removed, and development is carried out. Accordingly, tapered and straight shaped exposure resist sections 70 are left on the matrix 62. After that, as shown in FIG. 4F, electroforming is carried out using the conductive film 64 on the matrix 62 as an electrode for electroforming, and a metal layer 72 is grown to a thickness that reaches up to a prescribed position on the straight sections 70a of the exposure resist sections 70. The metal layer 72 is formed by nickel plating, for example. Finally, as shown in FIG. 4C, the metal layer 72 is peeled away from the exposure resist sections 70 and the matrix 62 (including the conductive film 64), thereby completing a nozzle plate 60.

Figure 6A:
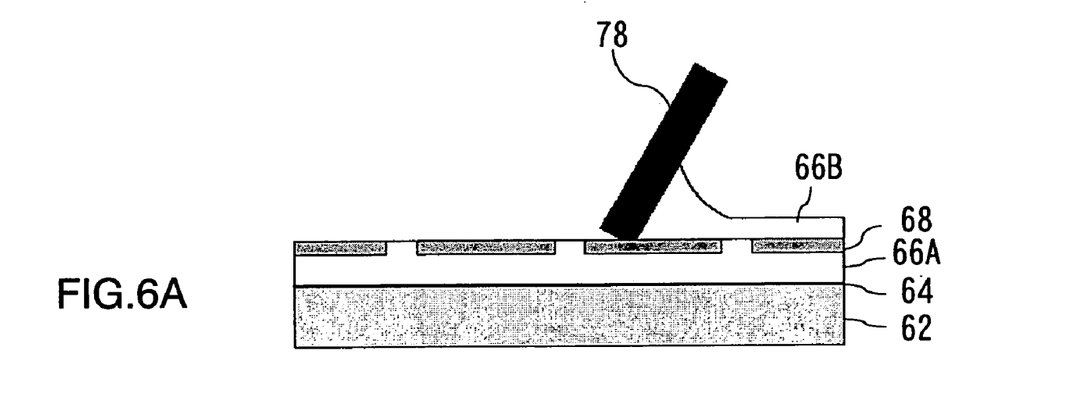
FIGS. 6A and 6B are illustrative diagrams showing a method of removing resist projecting over the surface of a straight section forming member.
Figure 6B:
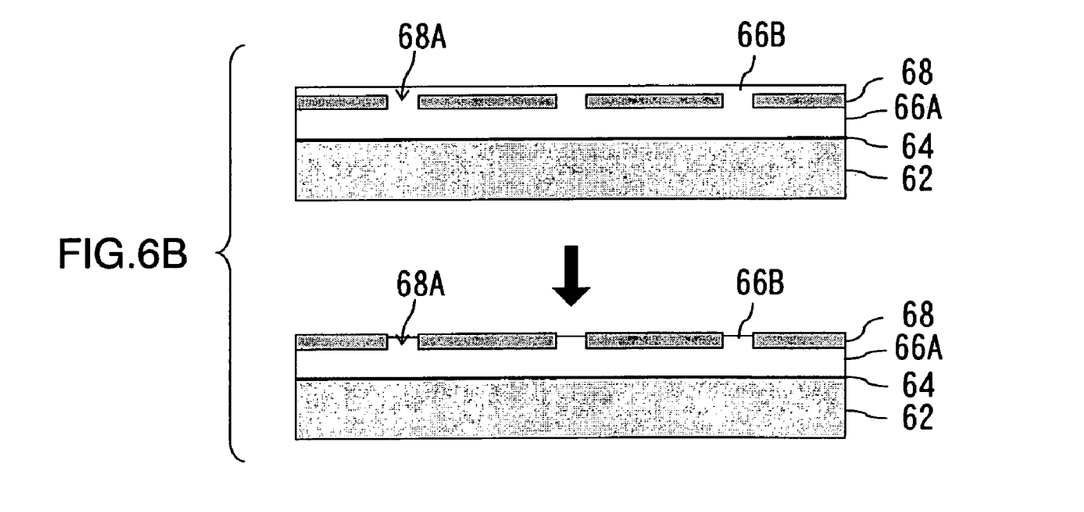

In the step shown in FIG. 4C, when resist 66B is reapplied from the side of the straight section forming member 68, desirably, the resist 66B should not project over the surface of the straight section forming member 68. If resist 66B does project over the surface of the straight section forming member 68, then the projecting resist 66B should be removed from the surface of the straight section forming member 68 by means of a squeegee 78 as shown in FIG. 6A, for example. Furthermore, as shown in FIG. 6B, it is also possible to remove the resist 66B which projects over the surface of the straight section forming member 68 by means of a solvent (or a developing solution, or a removal solution), or the like. If the projecting resist is removed with such a solvent, then there is a chance that the resist 66B inside the hole sections 68a of the straight section forming member 68 may also be dissolved. Therefore, it is desirable to form the straight section forming member 68 having a sufficient thickness, in advance, in such a manner that sufficient resist 66B remains inside the hole sections 68a even after removal of the resist 66B.

SECOND EMBODIMENT

Figure 7A:
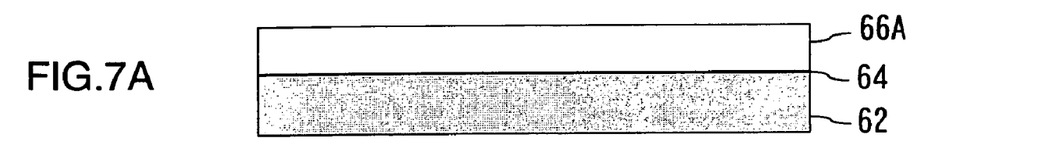
FIGS. 7A to 7C are illustrative diagrams showing a method of manufacturing a nozzle plate according to a second embodiment.
Figure 7B:
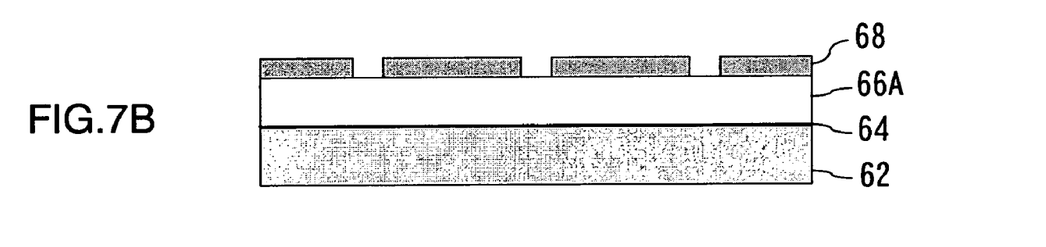
Figure 7C:
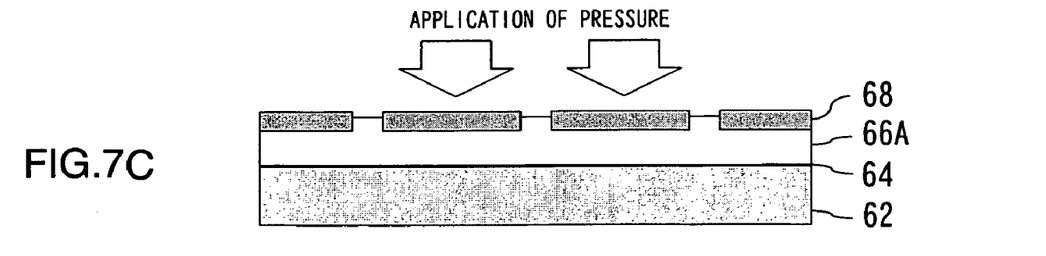

FIGS. 7A to 7C are illustrative diagrams showing a method of manufacturing a nozzle plate 60 according to a second embodiment.

Firstly, as shown in FIG. 7A, a negative resist 66A is applied onto a conductive film (electrode for electroforming) 64 formed on a matrix 62. Here, in contrast to the first embodiment, pre-baking is not carried out, and the resist 66A is in a liquid state. Next, as shown in FIG. 7B, the straight section forming member 68 is attached onto the resist 66A, and as shown in FIG. 7C, pressure is applied to the straight section forming member 68 and resist 66A is filled into the hole sections 68a of the straight section forming member 68. Thereupon, pre-baking to the resist is carried out. The subsequent processes are the same as the corresponding steps of the first embodiment (see FIGS. 4D to 4G), and hence description thereof is omitted here.

In the second embodiment, since the straight section forming member 68 is required to be placed on the resist 66A in the liquid state, the workability is poor compared to the first embodiment; however, by controlling the pressurization conditions of the straight section forming member 68, it is possible to prevent the resist from projecting over the surface of the straight section forming member 68, unlike the first embodiment.

THIRD EMBODIMENT

Figure 8A:
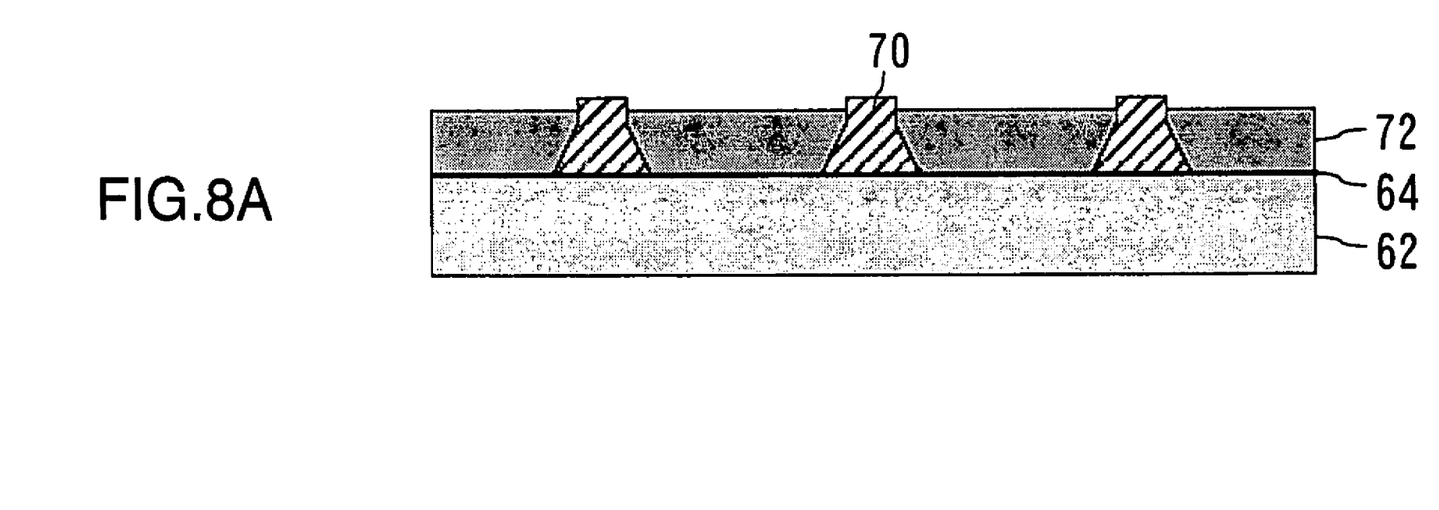
FIGS. 8A and 8B are illustrative diagrams showing a method of manufacturing a nozzle plate according to a third embodiment.
Figure 8B:
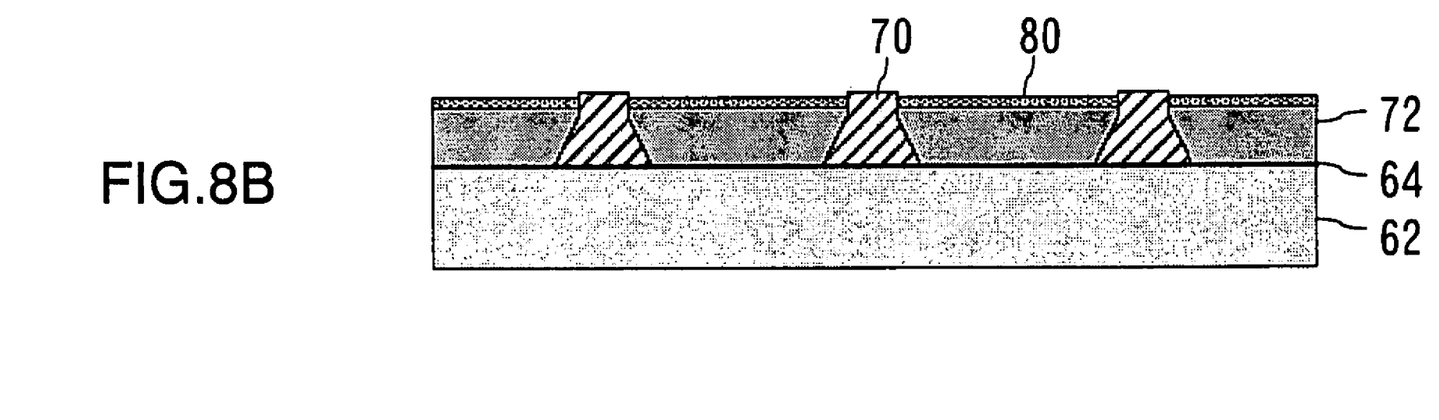

FIGS. 8A and 8B are illustrative diagrams showing a method of manufacturing a nozzle plate 60 according to a third embodiment.

As shown in FIG. 8A, after forming exposure resist sections 70 having a tapered and straight shape on the side of a conductive film 64 disposed on a matrix 62, a metal layer 72 is formed by electroforming. The corresponding steps of the first embodiment are the same as the steps up to this process of the present embodiment (see FIGS. 4A to 4F). Thereupon, as shown in FIG. 8B, eutectoid plating of Ni and PTFE is performed on the surface of the metal layer 72, thereby creating a liquid repellent film 80 on the surface of the metal layer 72. Subsequently, the metal layer 72 including the liquid repellent film 80 is peeled away from the exposure resist sections 70 and the matrix 62 (including the conductive film 64), thereby completing the nozzle plate 60. By forming the liquid repellent film 80 on the surface on the ink ejection side of the nozzle plate 60 in this way, adherence of ink droplets to the periphery of the nozzles can be prevented, and hence the stability of the direction of flight of the ink droplets can be improved.

Figure 9A:
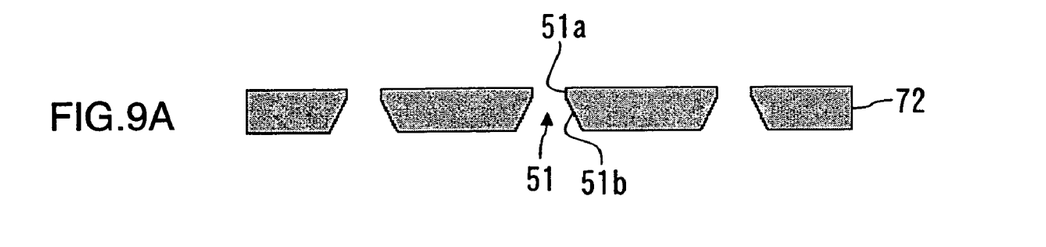
FIGS. 9A to 9C are illustrative diagrams showing a further method of forming a liquid repellent film.
Figure 9B:
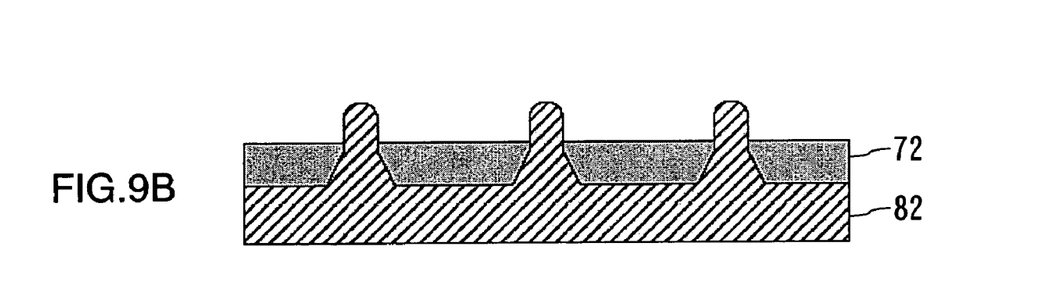
Figure 9C:
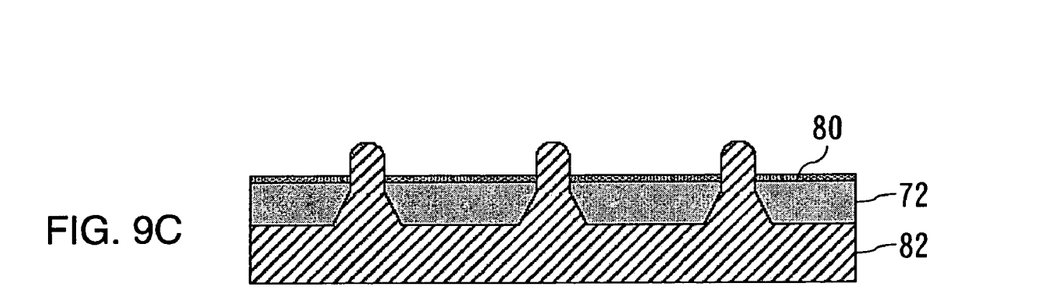
Figure 10A:
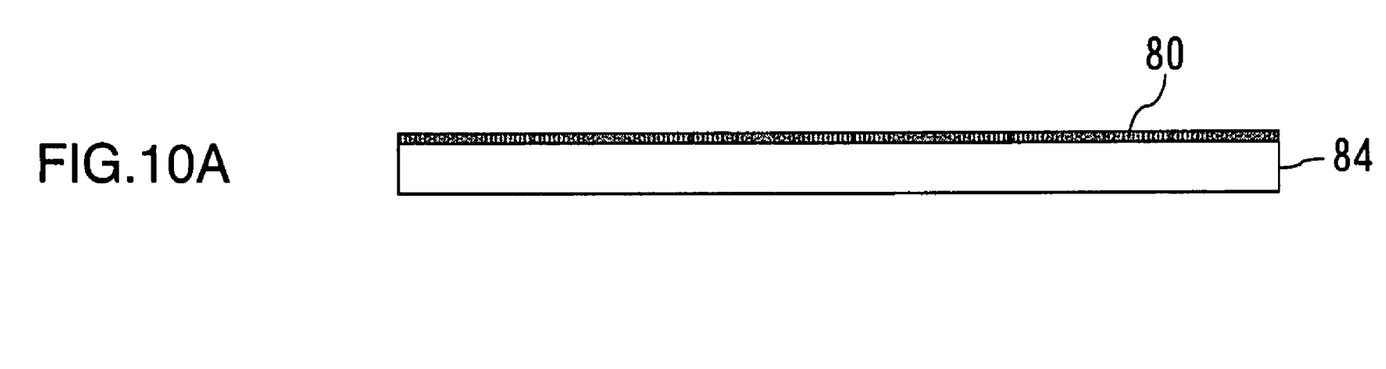
FIGS. 10A and 10B are illustrative diagrams showing a further method of forming a liquid repellent film.
Figure 10B:
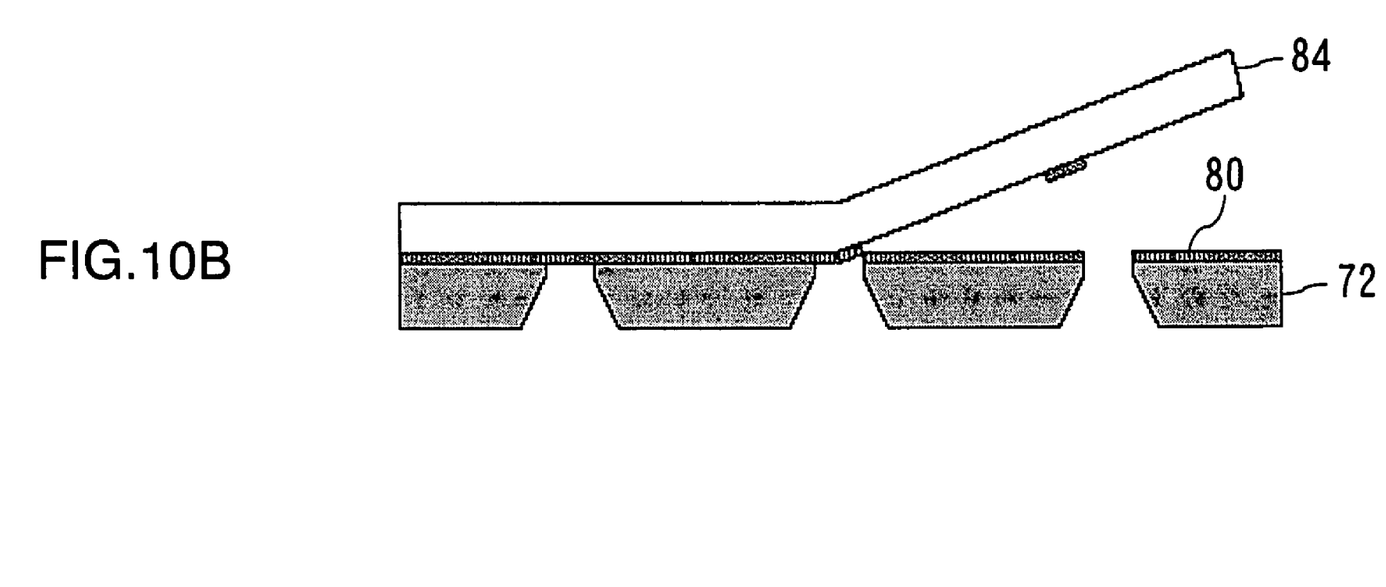

The method of forming a liquid repellent film 80 on the surface of the ink ejection side of the nozzle plate 60 is not limited to the embodiment shown in FIGS. 8A and 8B. For example, it is possible to prepare a metal layer 72 (nozzle plate 60) removed from the exposure resist sections 70 and the matrix 62 (including the conductive films 64) according to the first embodiment as shown in FIG. 9A; as shown in FIG. 9B, embed a resist 82 into the metal layer 72 in a comb shape so as to pass through each of nozzles 51 from the ink flow channel side which corresponds to the tapered section 51b side of the nozzles 51; and then, as shown in FIG. 9C, form a liquid repellent film 80 by carrying out eutectoid plating of Ni-PTFE onto the surface of the ink ejection side of the metal layer 72. Moreover, it is also possible to coat a liquid repellent film 80 onto a sheet 84, as shown in FIG. 10A, and then transfer the liquid repellent film 80 onto the surface of the ink ejection side of the metal layer 72, as shown in FIG. 10B.

As explained above, according to the embodiments described above, a resist 66A is formed in the shape of a layer on the matrix 62, a straight section forming member 68 is placed on the resist 66A, resist 66B is filled into the hole sections 68a in the straight section forming member 68, and exposure is then carried out by radiating a prescribed light from the straight section forming member 68 side (toward the straight section forming member 68). The straight section forming member 68 is then removed and a development process is carried out, thereby forming tapered and straight-shaped exposure resist sections 70 on the matrix 62. These exposure resist sections 70 are formed by a single exposure step, and therefore the straight sections 70a and the tapered sections 70b can be formed with good accuracy, and the straight sections 70a and the tapered sections 70b can be formed without the occurrence of positional displacement. By forming a nozzle plate 60 by means of electroforming using the exposure resist sections 70 as a mold, it is possible to form the tapered and straight-shaped nozzles 51 with good accuracy. Therefore, the ejection efficiency can be improved and the ejection direction can be stabilized.

Furthermore, by forming the liquid repellent film 80 on the surface on the ink ejection side of the nozzle plate 60, ink droplets are prevented form adhering to the periphery of the nozzles, and hence the stability of the direction of flight of the ink droplets can be improved further.

In the above embodiments, a metal layer 72 is formed by electroforming, but the implementation of the present invention is not limited to this. It is also possible to provide a seed layer for electroless plating on the matrix 62, instead of a conductive film 64 (electrode for electroforming), and to form a metal film 72 by electroless plating.

The methods of manufacturing a nozzle plate according to the present invention have been described in detail above; however, the present invention is not limited to the aforementioned embodiments, and it is of course possible for improvements or modifications of various kinds to be implemented, within a range which does not deviate from the essence of the present invention.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method of manufacturing a nozzle plate including a nozzle having a tapered section where a diameter gradually decreases from a liquid supply side toward a liquid ejection side, and a straight section which is substantially cylindrical and is situated nearer a liquid ejection side of the tapered section, the method comprising the steps of:

forming a first photosensitive material in a form of a layer on a substrate;

placing a straight section forming member including a hole section having a shape substantially corresponding to a shape of the straight section, on the first photosensitive material;

filling a second photosensitive material into the hole section;

radiating a prescribed light toward the straight section forming member, in such a manner that substantially all of the second photosensitive material is exposed and the first photosensitive material is exposed in a tapered shape having a diameter which gradually increases toward the substrate;

removing the straight section forming member from the first photosensitive material and the second photosensitive material;

carrying out development of the first photosensitive material and the second photosensitive material after removing the straight section forming member from the first photosensitive material and the second photosensitive material;

forming a metal layer which is to serve as the nozzle plate, on the substrate, by a plating method where the first photosensitive material and the second photosensitive material left on the substrate after carrying out the development of the first photosensitive material and the second photosensitive material are used as a mold; and removing the metal layer from the substrate, the first photosensitive material, and the second photosensitive material.

2. The method of manufacturing a nozzle plate as defined in claim 1, further comprising the step of forming the straight section forming member by electroforming.

3. The method of manufacturing a nozzle plate as defined in claim 1, further comprising the step of forming a liquid repellent film on a surface of a liquid ejection side of the nozzle plate.

* * * * *